(12) United States Patent
Reinert

(10) Patent No.: US 8,129,838 B2
(45) Date of Patent: Mar. 6, 2012

(54) HOUSED ACTIVE MICROSTRUCTURES WITH DIRECT CONTACTING TO A SUBSTRATE

(75) Inventor: Wolfgang Reinert, Neumuenster (DE)

(73) Assignee: Fraunhofer-Gesellschaft Zur, Munich (DE)

( * ) Notice: Subject to any disclaimer, the term of this patent is extended or adjusted under 35 U.S.C. 154(b) by 427 days.

(21) Appl. No.: 12/153,174

(22) Filed: May 14, 2008

(65) Prior Publication Data
US 2008/0283991 A1    Nov. 20, 2008

(30) Foreign Application Priority Data

May 14, 2007   (DE) .......................... 10 2007 022 564
Sep. 13, 2007  (DE) .......................... 10 2007 043 630

(51) Int. Cl.
*H01L 23/10* (2006.01)
(52) U.S. Cl. ........ 257/710; 257/685; 257/723; 257/724; 257/784; 257/E33.056; 257/E33.058
(58) Field of Classification Search .................. 257/685, 257/710, 723, 724, 784, E33.056, E33.058
See application file for complete search history.

(56) References Cited

U.S. PATENT DOCUMENTS

| | | | | |
|---|---|---|---|---|
| 5,939,633 | A * | 8/1999 | Judy | 73/514.32 |
| 7,204,737 | B2 * | 4/2007 | Ding et al. | 445/24 |
| 7,692,292 | B2 * | 4/2010 | Higashi et al. | 257/710 |
| 2004/0112937 | A1 | 6/2004 | Laermer | |
| 2006/0118946 | A1 * | 6/2006 | Alie et al. | 257/704 |
| 2006/0192281 | A1 | 8/2006 | Lu et al. | |
| 2008/0136000 | A1 | 6/2008 | Fischer et al. | |
| 2009/0007661 | A1 * | 1/2009 | Nasiri et al. | 73/504.03 |

FOREIGN PATENT DOCUMENTS

| | | |
|---|---|---|
| DE | 100 55 081 | 5/2002 |
| WO | WO 01/58804 | 8/2001 |
| WO | WO 03/054927 | 7/2003 |
| WO | WO 2004/040618 | 5/2004 |
| WO | WO 2005/118463 | 12/2005 |
| WO | WO 2005/118464 | 12/2005 |
| WO | WO 2006/012255 | 2/2006 |
| WO | WO 2006/085825 | 8/2006 |

OTHER PUBLICATIONS

Jean Gobet, et al., "IC Compatible Fabrication of Through-Wafer Conductive Vias", CSEM Centre Suisse d'Electronique et de Microtechnique; SPIE vol. 3223; 1997; pp. 17-25.

Seong Joon Ok, et al., "High Density, High Aspect Ratio Through-Wafer Electrical Interconnect Vias for MEMS Packaging"; IEEE Transactions on Advanced Packaging; vol. 26; No. 3; Aug. 2003; pp. 302-309.

* cited by examiner

*Primary Examiner* — Minchul Yang
(74) *Attorney, Agent, or Firm* — Hunton & Williams LLP

(57) ABSTRACT

A microstructured component with microsensors or other active microcomponent is provided. The microstructured component includes a substrate and at least one housing arranged on the substrate with one or more active microstructures situated on it.

35 Claims, 3 Drawing Sheets

HOUSED ACTIVE MICROSTRUCTURES WITH DIRECT CONTACTING TO A SUBSTRATE

CROSS-REFERENCE TO RELATED APPLICATIONS

Figure 1:
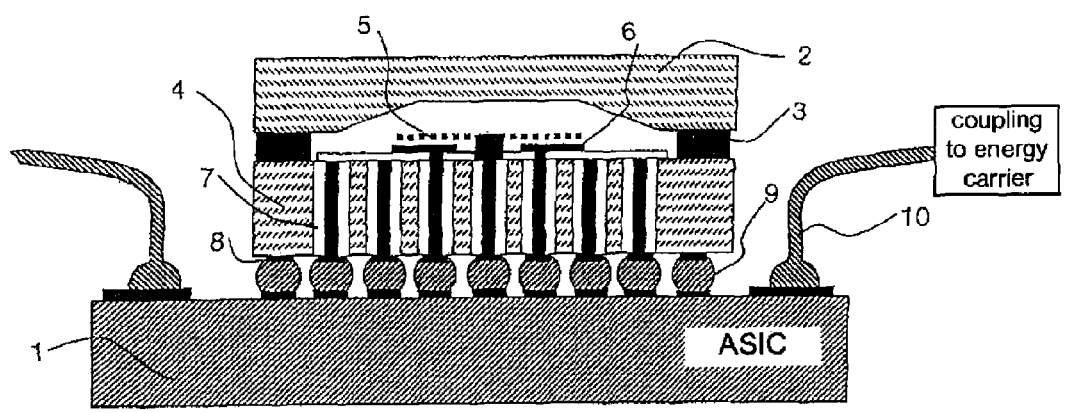

This application claims priority to German Patent Application No. 10 2007 022 564.6, filed May 14, 2007, and German Patent Application No. 10 2007 043 630.2, filed Sep. 13, 2007, the disclosures of each of which are hereby incorporated by reference.

The present invention contains microcomponents, like microsensors, which are contacted via their housing directly to a substrate, especially one with a semiconductor circuit for signal evaluation (ASIC).

Present day microsystem components are preferably produced with the manufacturing methods of semiconductor technology. Numerous components can be produced cost-effectively at the same time on this account. However, these components, because of their very small dimensions, are often very sensitive and must therefore be protected from external influences in the majority of cases during operation and even during production. This is achieved by hermetically sealing these components with protective caps.

Capping methods have long been known. It often happens that separate cover chips (cover wavers) are connected to a wafer containing the active structures. Methods that encapsulate an MST wafer (Micro System Technique wafer) on the wafer level have also long been known. In this case, a wafer, which can consist of glass or silicon, for example, and generally contains one or more cavities to accommodate active component parts, is connected by means of an anodic connection or by use of glass solder. The use of metallic or metal-containing solder is less extensive in wafer connection technology.

The design and connection techniques for microsensors and other active microcomponents must deal with the following problems, among others: electrical connections must be created between the sensor elements and an electronic evaluation circuit (which has circuits for driving the sensor element or elements, for measuring their signals and for communication with external electrical circuits). In addition, the frequently extremely sensitive microsensor components and/or semiconductor circuit must be protected from harmful environmental effects, like excess mechanical load, interfering electromagnetic radiation and undesired particles. Protection from liquids, gases or elemental particles can also be essential. Finally, the active system, i.e., the active component, like sensor/actuator or a combination of such components, must be integrated in a target system, for example, a circuit board, a housing or a surface exposed to environmental effects. Environmental effects can be both of the interfering type (for example, the influences described above or an inappropriate gas pressure, undesired gas composition), for which reason they must be prevented, or they can be useful (for example, a motion change or temperature to be detected), for which reason the latter should be determined undisturbed in the interior of the component. Instead of a direct sensor coupling between the measured quantity and the detection unit, an appropriate medium (for example, liquid or an optical lens) can also be used on the sensor for the measurement quantity relevant to the sensor system. Integration is facilitated, for example, by reducing the size of the space, the design height or the required base surface.

Another problem is contacting. This problem is more difficult to solve, the more contacts the sensors have and the smaller the electrical signals being transmitted are. Especially for complete inertial measurement units with 6 sensor components, the system is complicated by about 70 necessary electrical connections to the evaluation chip (for example, a semiconductor circuit for signal evaluation, ASIC). Surface consumption, the costs for chip-to-chip wire bonding connections, the variation of electrical connection properties (impedances) and control of adhesive wetting in a stacked arrangement speak against connection by thin wire bonding.

For housed systems, like microsensor components, there is the possibility of direct contacting through the chips. This is the most compact, although at present not the cheapest method.

J. Gobet et al., in their article "IC compatible fabrication of through-wafer conductive vias," SPIE, Vol. 3223 (1997), pages 17-25, describe the generation of conductive vias through a silicon wafer. The substrate protected by a negative photoresist is etched onto the uncoated sites by means of a plasma etching method, until a via is formed through the substrate. This is insulated by means of a parylene layer and then cladded with metal by means of a sputtering technique. At the same time, conductive structures are produced with this method on both sides of the substrate. However, the metallization step according to the authors is particularly critical, since sufficient deposition of metal can scarcely be achieved inside on the vertically running via walls. This problem is more difficult, the more unfavorable the ratio of diameter of the substrate to diameter of the via. The open through-holes also make it essential for metallization to choose a process strategy in which both sides of the substrate are coated with metal.

For economic and/or fabrication reasons, it is useful to configure a layout, so that the aforementioned aspects can be achieved with the least possible expense, i.e., with only few fabrication steps and limited use of material and energy. Microelectronic fabrication technologies are optimally suited for this, since a number of highly integrated components can be processed simultaneously and for the most part in automated fashion.

The task of the present invention is to provide a compact microstructured component or subsystem, which contains at least one, but preferably a number of housed active microstructures, like microsensors (for example, inertial sensors for velocity, acceleration, rotation, or sensors for moisture content, light, temperature, radioactivity or the like) and/or microactuators, among other things, and represents a microcomponent or can be divided into such components, in which the structure of this component or subsystem contributes to reducing the total cost for fabrication of the microcomponents, in which it can be produced with simpler means than were previously required for comparable structures.

This task is solved by providing a microstructured component with microsensors or other active microcomponents, comprising a substrate, which is provided with electrical conductor tracks, preferably with one or more semiconductor circuits, as well as at least one housing arranged on the substrate with one or more active microstructure situated in it, at least one, preferably each, of the active structures being contacted electrically through the surrounding housing to an electrical conductor track of the substrate and preferably to a semiconductor circuit.

Substrate and housing can be present on the chip level. This means that the substrate carries only one or a few housings that together form a component. The substrate can then be an individual part, for example, an already sawed wafer, which is optionally mounted, in turn, on a support or is situated in a housing. As an alternative and preferably, the substrate is present in a form in which a number of housings can be mounted on it, for example, as wafers. This then optionally carries a number of semiconductor circuits, each of which can be contacted to the outside and can be divided into individual components, for example, sawed, after fabrication. Accordingly, "component" below will be understood to mean design elements, in which preliminary stages of the components ultimately to be produced are generally involved.

Figure 2:
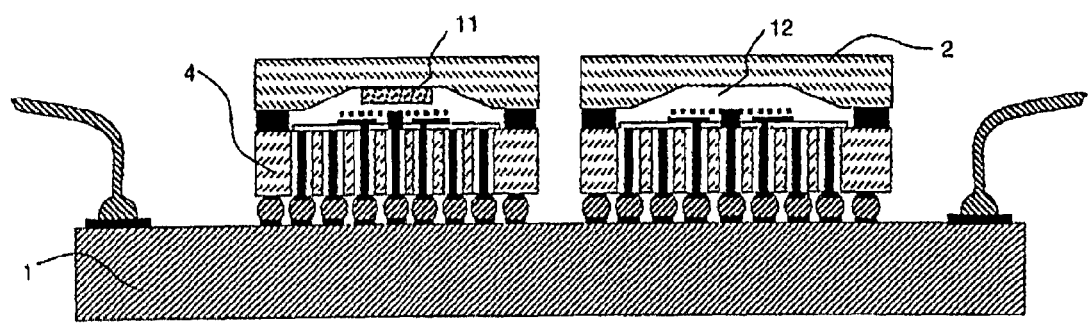
Figure 3:
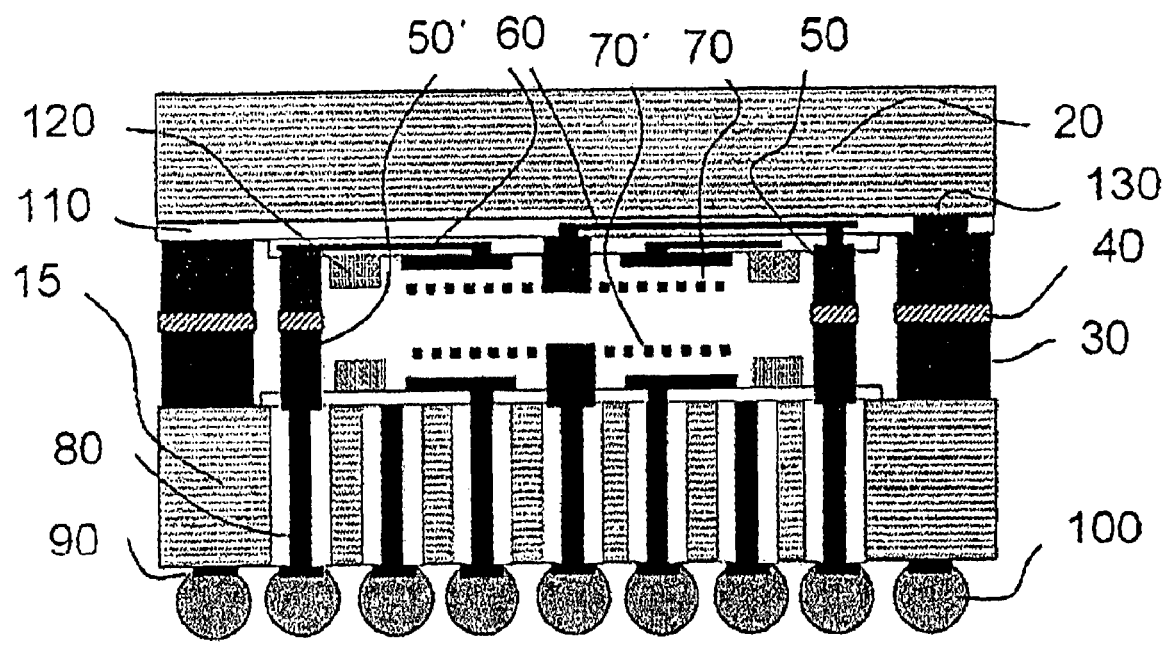

The invention is explained below as an example with reference to FIGS. 1 to x, in which an embodiment of the invention is schematically depicted in FIG. 1, FIG. 2 shows a variant of the invention, in which two housings with cavities, in which one or more sensors with different requirements on the surrounding atmosphere is/are accommodated, are contacted on a substrate, FIG. 3 shows a variant of the invention, in which two sensors are accommodated in a cavity of the housing.

In particular, any substrate that can be used for microcomponents or subsystems is suitable as substrate in the present invention for the reasons mentioned above. However, preferably the substrated is an ASIC, i.e. a substrate with an integrated circuit specific for the application. This relates primarily to a silicon wafer or another semiconductor component, e.g., based on SiC, GaAs, or InP; however, if applicable, the substrate can also be a circuit board, a glass support or the like; however this is less beneficial. In particular, the substrate should not be flexible but rigid and preferably be made from an inorganic material. The basic task of the substrate, in the first place, is to provide contacts for the electrical connections emerging from the housing or housings, and, in the second place, to provide at least one contacting site for wiring of the later microcomponent with the necessary external components for transfer of the signals received from the active structure or structures (sensors, actuators) or to be sent to them, from which the corresponding electrical data can be tapped. Therefore it is favorable, if the substrate itself includes one or more appropriate circuits, for example, electronic evaluation circuits, including circuits for driving the sensor element, measuring its signals and/or communication with external electrical circuits. It is beneficial if the ASIC is embodied such that the signals emitted by the active structural elements are amplified and/or linearized and/or intelligently filtered. Additionally, It is beneficial for the temperature path of the signal to be compensated by calibration points (scale factors) saved in special storage cells (ten-cap, EEPROM). Depending on the application, ASIC may serve additional functions. They may comprise, for example, closed control circuits to control the position of oscillating micro structures (e.g., a reflective angle to control the energy supply, light diffusion to zero, and to avoid distortions of the image) in the sensor. Additionally it is beneficial when ASIC can perform a self-test of the micro-sensor and control measured signals for credibility and/or an intelligent processing of actuating positions. Existing micro-processors or signal processors in ASIC can still be used e.g., to subject the digital signals of image sensors to an adjustment of brightness.

In many cases, the disentanglement of a large number of signals is facilitated by such an electronic preprocessing within the subsystem. In these cases, the external contacting of the substrate and/or ASIC can occur conventionally by thin wire bonding, because of the small number of electrical connections (about 20-24 for an inertial measurement unit (IMU) with 6 axes). However, instead of thin-wire contacts any other electric contacts of ASIC are possible to the exterior, for example flip-chip contacts or thin-film contacts. The type of these contacts is irrelevant because here the signal level is very high and usually the digital signals are placed on a bus.

Any substrate on which a housing or a number of housings is to be placed in order to permit electrical rewiring of protected active structures is suitable as substrate, for example, arrangement of (if necessary, rotatable) image sensors or mirror elements in an at least partially transparent housing for protection from environmental effects, and combining this housing with a transparent substrate, optionally with redistribution of the contact sites required by the technology on a larger surface, so that the beam path from an external light source (for example, a laser) to the image sensor or mirror is unhampered.

Contacting of the electrical connections emerging from the housing or housings to the substrate or its electrical conductor tracks/semiconductor circuit(s) occurs freely on the bottom of the corresponding housing. The type of connection is freely selectable; they preferably consist of solder bumps, which are connected via a solder connection (preferably with soft solder) to the electrical connections emerging from the housing(s) and with contact arrangements arranged in the same way on the surface of the substrate/semiconductor circuit(s). As an alternative to soldering, the electrical connections can also be made by anisotropically conductive gluing, by isotropically conductive gluing, by unfilled narrow gap glue connections or by diffusion soldering. In all cases, the connections simultaneously serve for mechanical fastening of the housing or housings on the substrate.

The direct connection to the solder bumps reduces the parasitic influences of the contacts, such as occurring by high impedances during wire bonding, and thus considerably reduces the development expense for ASIC because the automatic adjustment area can be signed smaller. Smaller signal levels by minimized sensors can still be processed. Here, very compact multi-axial sensors can be realized.

The contact via a flip-chip solution is self-centering and allows a very precise axial alignment in minute tipping errors.

The arrangement of one or more housed micro-sensors on an ASIC leads to a stiffening effect, by which negative bulging on the sensor caused by housing stress is reduced. This is particularly important for micro-sensors with thinned housing structures. Any bending of the micro-sensor would lead to an undesired bias-signal.

In addition to testing, the sensor calibration can be performed on a wafer level. Here, the typical packaging stress expected can be considered as a derivative value. Due to the very high savings such sensor calibration on the wafer level is very advantageous. The savings result particularly from the strongly shortened delay terms for bringing the components to the test temperature (e.g., −40° C., room temperature, +125° C. in a closed test environment with nitrogen), because it occurs in the compound wafer and the thermal mass is still very small. The measurement can be applied electrically (by electrodes provided for said purpose), mechanically (by a rotary or tipping table, if applicable with Piezo-shaker, if applicable with atmospheric pressurization), or optically (by laser light or IR-light coupling).

Each of the housings has one or more active structures corresponding to the use of the future microcomponent and is preferably formed from a bottom element and a cover element, the active structure(s) being situated between these two elements. If several such structures are present, they can be arranged according to requirements in the same cavity in the vicinity of each other or can be separated from each other, for example, when they require different environmental conditions (different pressures, gas compositions, moisture contents, etc.).

The expression "active structure" according to the present invention will include structures, which record environmental effects, like velocities, accelerations, rotations, light radiation, moisture, magnetic field, soundwaves, pH value, temperature or the like, and can convert them to electrical signals (referred to below as sensors), which absorb, convert, store and/or release electrical, electromagnetic, mechanical or thermal energy (for example, batteries, accumulators) and/or execute movements (actuators), but are not restricted to them. For example, components prescribed for air bags can contain three different acceleration sensors, which can detect accelerations in the three spatial directions x, y, z. A chip can contain different active structures with different tasks, for example, different sensors and/or batteries that require different environmental conditions for their operation.

The bottom and cover element of each housing can be individually equipped and machined as required, as explained below in detail. However, it is preferred that the elements be produced on the wafer level, i.e., in the form of a bottom wafer for a number of bottom elements, and optionally also in the form of a cover wafer for a number of cover elements. Each bottom element on the bottom wafer can be closed after fabrication with individual cover elements (cover chips); instead of this, the bottom wafer can also be connected to a cover wafer. After fabrication, the bottom wafer, optionally together with the cover wafer, is divided by sawing or the like into a number of housings, each of which contains the required active structures.

The bottom and cover element of each housing are preferably connected to each other via a sealing frame. This defines the spacing between the surfaces of the bottom and cover element. It is therefore chosen high enough, so that the active structures can be reliably housed without abutting. The surface(s) of either the bottom element and/or the cover element can be flat or have a recess to accommodate the active structure(s) or a getter material, so that the sealing frame need not have the height of the active structures. The sealing frame ensures mechanical connection between the bottom and cover element. It can consist of any material that has the required rigidity, for example, an organic polymer material, like polyimide or benzocyclobutene (BCB), or an inorganic material, like a metal or an alloy or glass or glass frit. Metals, like Au, Pd, Al, or alloys, like those from Cu—Sn or Cu—Au, are suitable. The frame can consist of a single material or be produced by joining different metals applied to the bottom element and the cover element, which form an alloy in the connection area. Examples are gold- or tin-containing eutectics, preferably a gold-tin or gold-silicon eutectic. It can be applied to a substrate of adhesion promoter and/or a nucleating metal.

The expression "sealing frame" is not to be absolutely understood to mean that this is completely continuous or completely sealing/hermetic. Instead, the sealing frame can also be interrupted, if the active structures can/must operate under environmental conditions. It can optionally be divided, so that it encloses several spaces, so that different active structures can be separated from each other. The fact that this can be necessary was already explained above. If these cavities are separated in a defined gas atmosphere by joining of the bottom and cover element from the surrounding atmosphere, the gas pressure or gas mixture in one or more of these spaces, for example, can later be converted, so that a getter material is applied in it, which, during activation in a definable manner, absorbs gas molecules and therefore alters the gas atmosphere. Getter materials can also be used to absorb moisture or even trap particles. This getter material, for geometric reasons, is preferably provided on the substrate surface.

Finally, the sealing frame can also be equipped, so that it only encloses a part of the active structure prescribed for the component, whereas at least one of these active structures remains exposed to the surrounding atmosphere or the medium, in which the active component is supposed to operate. This can be favorable, for example, when the microcomponent being generated must have a moisture sensor. As an alternative, the sealing frame can be configured by introducing materials with high specific permeability, so that it permits a limited or controlled gas supply for this structure/these structures. For example, it can have continuous layers from the outside in of palladium (permeable to hydrogen), $SiO_2$ (permeable to helium) or carbon-nanotubes, the latter material being water vapor-permeable.

In a specific embodiment of the invention, the sealing frame has a special geometric configuration, for example, a fluid channel. For this purpose, it can be designed at the required sites as a double-channel, into or from which liquid can flow in or flow out through two substrate holes.

Contacting of the active structures on the substrate, which occurs through the housing, is preferably accomplished by so-called vias, i.e., electrically conductive passages, optionally insulated relative to the substrate. Such passages are known from the prior art.

The passages can be generated by the fact that the housing part (bottom element) facing the substrate has an electrically conducting contact site on at least one location on its inside, which is connected to a corresponding active structure. A conducting structure extends from the contact site through a recess in the housing part, where it emerges from the housing as contacting and is electrically contacted, as explained above.

A very favorable method for generation of the mentioned passages includes the following steps: recesses are formed from the back side of the housing element, which is to be provided with the passages, for example, of an individual bottom element made of silicon or a corresponding wafer, which is already provided with corresponding electrically conducting contact sites, so that the recesses end on the front of the bottom element beneath the location, at which the corresponding electrically conducting contact site is situated, so that the recesses are fully covered by it. Electrically conducting material is then introduced from the back side of the bottom housing part into this recess, so that conductive connections through the recesses are made between the corresponding contact site and the rear surface of the bottom element. The passages are then preferably widened to the outside of the housing, so that each recess has a cross-sectional surface that becomes smaller in the direction of the front of the substrate. It is more strongly preferred that the recess in the bottom element be essentially conical, with particular preference having a flank angle of about 70-90°, better about 75-85°, and especially about 80°.

Considering the suitability for formation of passages, semiconductors, like silicon (for example, in the form of silicon wafers), are considered as materials for the bottom element or the housing, but also other known conducting substrate materials, like GaAs, glass, Pyrex and ceramics; the method is not restricted, in particular, in this respect.

The preferred technology used for production of passages exploits the possibility of a process and process parameters that do not alter the pre-processed components (as mentioned, for example, in the wafer level) in their functional properties. In particular, all steps can be conducted at temperatures below 400° C. Readily IC-compatible auxiliaries and materials can be used for this purpose. Special processes during lithography are avoided by the fact that open holes in the semiconductor material are not present at any time.

The method is applicable to uncoated bottom elements, and also those, whose surfaces are covered on one or both sides with a coating, for example, passivation. An example of this is a silicon wafer covered with a thin $SiO_2$ layer.

Since this layer, on the front, might be able to represent a barrier for the continuing etching of the back side, as would be the case in the aforementioned situation of a silicon wafer covered with $SiO_2$, in such cases, the electrically conducting contact site is optionally arranged in or under the mentioned layer. In such cases, the front of the substrate can be structured beforehand without problem, for example, by etching off this layer at the desired contact points and by applying electrically conducting contact material at this site.

Formation of recesses in the bottom element from its back side preferably occurs by means of an etching process. In this case, recesses are etched on the bottom element-back side via a lithographically generated mask. The mask can be applied to the bottom element, so that it can later be removed or eliminated in some other way; however, it can also consist of a material that adheres to the bottom element, for example, a coating or aluminum layer resistant to the etching medium or an $SiO_2$ layer ("hard mask"). This can, but need not remain subsequently on the substrate. Etching can be a plasma etching process, using an appropriate gas mixture. This can contain an oxidizing sulfur hexafluoride, if the substrate is a silicon wafer. Silicon can be treated, in particular, by means of so-called deep reactive ion etching (DRIE). Such etching methods attack silicon, but not $SiO_2$, aluminum or the coating. Instead, depending on the material, etching with KOH or a tetramethylammonium hydroxide solution (TMAH) in water can occur (35 wt. %), or the recess generated mechanically, for example, by ablating UV laser radiation.

The obtained recesses can have any diameter. Diameters from about 10 to 500 µm, preferably 20 to 100 µm, are frequently sought.

As already mentioned above, it is favorable, if the recesses acquire a cone-like shape, in which the cross-section of the recesses diminishes in the direction of the front of the substrate. The flanks of this recess are much better accessible during later coating processes and permit more uniform application material than a passage with the same diameter and high aspect ratio. The recesses can, but need not be uniform or symmetric. The cone-like shape of the recesses can extend over the entire thickness of the bottom element; instead, however, one can also operate with a so-called "underetching," in which the hole diameter only widens just behind the back outer surface to its maximum diameter and then tapers cone-like.

A flank structure can be achieved, for example, by etching according to the Bosch method (alternating use of etching gas, for example, $SF_6$, and a gas that can ensure passivation by plasma polymerization, for example, $C_4F_8$) or by means of a dry etching process with $SF_6/O_2$ as mixed gas, in which $SiO_2$ is formed as inorganic side wall passivation.

In the usual Bosch process, ions and radicals are formed in the process gas. The ions are directed toward the wafer by a bias voltage, ablate the passivation layer by their sputtering effect on impact and react there with silicon to gaseous SiF. Very few ions strike the side walls. If the bias voltage is switched off and etching primarily carried out with the neutral particles in the already exposed area, in which the percentage of neutral particles is optionally increased by increasing the working gas pressure, one can influence formation of the side wall passivation. This can additionally occur by the duration of passivation. An unclosed side wall passivation can be attacked by the neutral particles, so that an outward directed etching effect is produced. By controlling the ratio of directed ion etching (by different bias voltage) to side wall passivation thickness with the same working gas pressure, the formation of a hole angle can therefore be determined.

The conditions of the etching process are chosen, so that the electrically conducting contact site situated on the front of the bottom element is exposed from the back, but not attacked. When the contact site is exposed, the etching process is stopped on this material, because of its very limited ablation rate. The contact site then covers the formed recess to the front, so that the bottom element remains continuously gas-tight.

The contact sites themselves are formed according to the requirements of the later component. They will generally consist of an appropriate metal that was sputtered on or evaporated on. Wire bond surfaces can, but need not be involved.

Filling of the recesses with electrically conducting material can occur by usual techniques, for example, physical sputtering, evaporation, electroplating or currentless deposition from solutions. At the same time, conducting material can optionally be applied to appropriate sites on the outer back side of the bottom element. The conducting material can be applied in one or several layers. Appropriate materials for this are metals, like titanium, chromium, tungsten, TiN, aluminum, nickel, gold, silver or copper, or alloys containing these metals. Appropriate multilayer metallizations include Ti/Ni/Ag, TiW/gold, Cr/Cu/Au, Al/NiV/Cu or Ti/TiN/Cu. In one embodiment, a continuous conducting layer is first generated, which can then be structured by usual methods, like preferably spin or dry resist lithography and wet etching, but also by dry etching or lift-off technology. Both the metallization around the passages and conductor tracks and solder contact surfaces can be structured simultaneously. The solder surfaces can be arranged structured, apart from the passages, or overlap with the passages. In this case, contact materials are directly applied to the passage.

As an alternative, the conducting structure can naturally be applied directly in structured form by means of a mask.

In those cases, in which the bottom element is to be insulated relative to the electrically conducting passages, or this is desired, a passivation layer is arranged on the bottom element before application of the conducting material. When the material of the bottom element is silicon, this can consist of silicon dioxide, silicon nitride or a silicon oxide-nitride. The advantage of such passivations is their high temperature resistance.

As an alternative, in all cases, regardless of the material of the bottom element, an insulating polymer, especially an organic or inorganic-organic polymer, can be applied. Materials that are relatively temperature-resistant are also suitable for this purpose. Inorganic materials are therefore also considered, but also organic polymers, like parylene, which is stable up to about 290° C. The passivation layer can be applied in any thickness; 0.4-2 µm is favorable, for example.

The passivation layer can be applied in any way. Low temperature plasma or plasma-supportive methods are also suitable for this, for example, for a case, in which the layer consists of parylene or SiN.

The passivation preferably covers not only the recesses in the bottom element, but also desired parts or even the entire back of the bottom element. As an alternative, it can be applied structured.

If the passivation layer is applied directly, so that it also covers the back sides of the contact site situated on the inside, these must be exposed again before application of the conducting layer. This can occur by means of a gas phase etching process. When the metal of the contact site during passivation was oxidized or was oxidized for other reasons, it can be deoxidized again by argon-ion bombardment. The subsequently deposited metal layer thus has a small transfer resistance and high current loadability.

After production of the passages, the back side of the bottom element, as required, can be covered partially or completely with a passivation layer, except for the locations (solder surfaces) and/or sawing paths provided for later contactings. This layer preferably consists of benzocyclobutene (BCB) or polyimide (PI). Other organic polymers, but also inorganic-organic or purely inorganic materials, like $SiO_2$, can also be considered for this. The passivation layer can be subsequently structured, for example, lithographically, or also applied structured, for example, via a mask or in a structured printing process.

An embodiment of the invention is schematically depicted in FIG. 1. It shows a microsensor provided with hermetic via passages 7, which is electrically contacted on a substrate 1 with integrated semiconductor circuit. The sensitive active structure (here: sensor structure) 5 is situated on a housing made of a bottom element 4 and a cover element 2 and is protected by an optionally hermetic sealing ring 3 from external effects, which connects the two parts to each other. The active structure 5 and the electrodes 8 belonging to it are connected by electrical conductor tracks and electrical current passages (vias) 7, individually insulated relative to the sensor support substrate in conducting fashion with contact arrangements under the sensor component. The contact arrangements 8 can be arranged freely on the bottom. The contact arrangements are equipped with solder bumps 9, in order to permit a solder connection to equivalently arranged contact arrangements on the surface of the semiconductor circuit. The control of the semiconductor circuit and tapping of its output signals occurs via electrical connections 10.

As already mentioned above, the present invention is readily suited for implementation of an inertial measurement unit. For this purpose, different sensor types must be integrated in hybrid fashion. In order to meet the respective requirements the sensors must be hermetically sealed in a housing kept at a pressure and/or atmosphere necessary for their operation. Additionally or alternatively, getter material may be applied in the cavities housing the sensors, i.e. at the inside of the housing, by which subsequently the pressure can be lowered and/or the inserted atmosphere can be adjusted by the absorption of some of the gas molecules, as known from prior art. It is useful to accommodate sensors with a vacuum requirement in the sensor cavity (for example, rotational rate sensors) in a sensor chip and sensors with high gas exposure (for example, acceleration sensors) in a separate sensor chip. Because of this, both the costs for a getter coating are better utilized and greater degrees of freedom in sensor design are also achieved (thickness of the polysilicon layer, height of the cavity, etc.).

Such a unit, here with two separately housed cavities for sensors or actuators with different requirements on the surrounding atmosphere, is shown in FIG. 2. Such structures, which are comparable to those in FIG. 1, are partially provided with the same reference numbers and are partially without reference numbers. Reference number 11 denotes getter material in one of the housings; reference number 12 indicates the cavity in the second housing, which can have a different gas composition and/or a different pressure than the space in the first cavity.

Overall, a mechanically rigid, compact unit with a height under 1000 μm can be produced by this arrangement. Such units are of interest for the consumer market and for the vehicle market. If the units are produced not individually, but on the wafer level, they can be comprehensively tested at low cost at this level. All known packaging technologies are available for further processing. No particle or handling problems arise through the processing of capped sensors. The measurement data of sensor measurement can be further used after the additional housing, when the substrate is or includes an ASIC and this has a distinct chip number in a register. Costly individual calibration can possibly be avoided in this way.

The invention is suitable for all sensor structures capable of calibration, especially inertial sensors, image sensors, microphones, pressure sensors and other sensors, but also for directly controlled actuators (for example, mirrors), which can optionally be coupled to appropriate energy carriers, like batteries or accumulators.

Particularly specific embodiments of the invention are geared toward components, in which at least two active structures are accommodated in a single cavity of the housing. In order to arrange them in a spatially favorable manner, at least one of these structures can be applied according to the invention on the cover element of the housing, whereas at least a second of these structures is applied on the bottom element.

The at least two mentioned structures can be two or more sensors that measure an acceleration or a rotation rate around two or three perpendicular axes of the space. As an alternative or in addition, at least one active structure can be a sensor that measures a property of the cavity, in which it is accommodated (for example, with at least one additional sensor that preferably measures an external property). Examples of such sensors are moisture sensors or pressure sensors to check housing tightness. Moisture sensors can be present, for example, in the form of a moisture-sensitive dielectric, for example, in the form of uncompacted (nanoporous) $SiO_2$. An increase in moisture content can then be determined by the change in dielectric constant of this material, which can be determined by means of high frequency impedance measurements. An alternative is the provision of a microresonator from nanoporous (etched) silicon. Here, detection of water molecule incorporation in the pores of the oscillator occurs by measuring the frequency shift.

As already explained above, the bottom element and the cover element can then be equipped individually or a bottom wafer, after fabrication of the internal structures, can be covered with a cover chip or with a cover wafer, whereupon the individual housings provided with the active structures are generated in a separation process, for example, by sawing.

For the specific variant of the invention mentioned above, the same production methods can be used, but in which it is particularly favorable to work at the wafer level, both for the cover element and the bottom element. In this case, both wafers are equipped with active structures, for example, sensors, the bottom wafer is provided as described above with passages and the wafers are joined to each other via sealing frames. In this case, a high integration density is achieved. By using hermetic vias through the bottom elements, the chip surface (base surface of the individual housing) can be kept particularly small and a very compact multisensor component with high robustness can be produced. This variant of the invention is particularly interesting for multiaxial inertial sensors for navigation and safety applications.

The housing of the mentioned variant of the invention is schematically depicted in FIG. 3. A first sensor 70 is situated on a cover element 20. This sensor is contacted with electrical variable contacts 50, 50' that represent a connection to a bottom element 15 via conductor track 60 made in element 20. An additional sensor 70' is situated on the bottom element 15. Frame metallization 30, which starts in both sides (bottom and cover element), is connected via a metal joining material 40 and joins the bottom and cover element to each other. With respect to configuration possibilities of this connection frame 30, 40, the above comments can be referred to. The bottom element possesses insulated current passages (vias) 80, which are connected to the electrical contacts of the lower sensor and to the electrical vertical contacts. These can be formed as described above. Contact surfaces 90 are present on the outsides, on which solder balls 100 are applied. The alternatives of contacting described above, however, can naturally also be used in these variants. If necessary, getter material can be arranged in the cavity at the appropriate free sites, which is designated 120 in FIG. 3.

With reference number 130, a variant is shown only on the right side of this figure: if desired, a contacting structure 130 can be provided in the area of the sealing frame or in the area of a vertical contacting (not shown), which sets the substrate crystal of the upper sensor at ground potential or any control potential and therefore can prevent electrical charging effects.

Electrical vertical contacting between the cover element and the bottom element occurs via contact sites that are opposite each other. These can be implemented as so-called bumps, raised structures in the corresponding elements that are in electrical contact with each other. The mechanical connection between the bottom and the cover element (i.e., the sealing frame) can also be formed from conducting material. The materials for the sealing frames and the contacts can be the same. In these cases, layout of the material for the sealing frames and the contacts can, but need not occur together, which saves working steps and costs.

For this purpose, both the bottom element(s) and the cover element(s) are treated in appropriate fashion. The steps can include galvanic or currentless deposition metals. If a galvanic method is chosen, the bottom and/or cover element surfaces can be provided with a continuous metal layer (potential layer) in a first step, for example, optionally with titanium as primer (acts as adhesion promoter), and a layer of one or more appropriate metals deposited on it, like Cr, Ti, Cr/Cu, Ti/Cu or TiN. This layer is applied in appropriate thickness, for example, with 3-50 nm, preferably about 5-20 nm, and especially about 10 nm. An additional gold layer can optionally be deposited as uppermost layer, which has a thickness of up to about 200 nm, preferably up to about 100 nm.

The metal is overcoated with a photoresist, which is then structured using an appropriate mask. The exposed surfaces are then provided with the actual metal layer, which can consist, for example, of gold, copper, nickel, or optionally also palladium or a combination of these materials. The gold layer can optionally be further covered with a tin layer. For these metallizations, the potential layer is placed under current. The metal layer is allowed to grow in sufficient total thickness (thickness on the substrate plus thickness on the chip), so that the active structure(s) on the chips after connection have sufficient space between the substrate and chip surface. The total thickness can be about 0.5 µm to 50 µm, preferably 2 to 20 µm, depending on the structures in the housings. If an Sn layer is additionally to be present, a thickness percentage of about 1-3 µm for this is sufficient.

The coating (preferably by means of appropriate solvent) and then the metal primer (for example, dried, by argon bombardment or etched away in a wet etching method that eliminates the very thin start metallization) are then ablated.

Gold, nickel, copper, optionally palladium or the above described combinations of these are preferably then used as uppermost layer when the structure of the contacts and the sealing frame are to occur only on one side, the bottom element or the cover element side. These metals can react during later pressing with the opposite surface. If this, which is preferred, consists of silicon, an intimate connection of a metal-silicon alloy is formed, which has a relatively high melting point. In such embodiments, Si elevations or rings can be formed on the cover element surface, which are accomplished by means of etching methods. As an alternative, a structure with a gold layer is produced on both sides. In this case, the aforementioned thin tin layer can then be applied on one or both sides (bottom element and/or cover element side). If the bottom element and cover element are pressed together, an Au/Sn alloy can be formed between the parts, which melts higher than the pure metals. This technique is also referred to as reactive joining ("soldering").

If required, the sealing frame and the contact structures are produced instead from different materials and/or by a different technique. They can then each consist of metal. The sealing frame instead can also consist of an organic material, for example, polyimide or benzocyclobutene (BPB). This material is applied flat on one or both sides (cover and/or bottom element side) in the form of prepolymers or monomers and exposed through an appropriate mask. After dissolving out of the unexposed material, the structured sealing frame is obtained.

Instead of the above method, any other method can actually also be used. Aluminum structures can be sputtered or evaporated on. In particular, it can be favorable to solder on the contacts in the form of bumps or apply them in a different way, point-like without prior surface coating.

The distance between the substrate surface and the sensor surface can be very precisely adjusted via these bumps.

The bumps or other raised contact sites can advantageously also be used as structures for adjustment between the bottom wafer and the cover element/cover wafer or the individual housing elements. For this purpose, they or some of them are slightly higher (for example, about 0.5-5 µm higher) than the sealing frame. Connection of the bottom element/bottom wafer to the cover element/cover wafer in these cases preferably occurs in two stages. In the first stage, the parts are brought into the correct horizontal position relative to each other and prefixed to store this position. For this purpose, 1 to 3 holding points per (later) housing are sufficient; for example, up to 4 holding points are favorable. The sealing frame should still not be sealed in this phase, and it is desirable that a gap of about 1-2 µm be left. The fixation process preferably occurs with a preheated substrate (favorably 100-150° C.) and a moderate pressure (often 20-35 g pressure per fixation structure of the chip is favorable). Ultrasonic introduction into the chip (lateral or vertical) is also advantageous, so that both the force and pretempering and process time can be reduced. Ultrasound introduction can be carried out with or without component tempering, in which it must be kept in mind that the temperature of the parts remains below the melting point of the lowest melting metal. Organic joining aids should generally be omitted in this process variant.

In a second stage, the prefixed component is then transferred to a chamber, in which a desired gas atmosphere is provided with the pressure (or underpressure/vacuum) that is to prevail after pressing into the cavities of the finished component. There, the bottom element/bottom wafer is pressed with the cover element/cover wafer, using appropriate pressures, for example, about 20-60 $N/cm^2$, optionally with heating of at least one of the sides (generally the bottom wafer) or both sides. The temperature for this purpose depends on the employed materials and can be determined without difficulty by one skilled in the art. During sealing through a double-frame with gold or copper on its surface, it generally lies at about 240-420° C., but can naturally be adjusted appropriately, if other materials are used. Pressing occurs, so that the desired tightness is achieved.

The invention claimed is:

1. A microstructured component with microsensors or other active microcomponents, comprising:
   a substrate comprising electrical conductor tracks and at least one housing arranged on the substrate;
   at least two active structures accommodated within a single cavity of the at least one housing and at least a first one of the at least two active structures being applied on a cover element of the at least one housing, whereas at least a second one of the at least two active structures is applied on a bottom element of the at least one housing;
   at least one of the active microstructures being electrically contacted through an enclosing of the at least one housing with one of the electrical conductor tracks of the substrate;
   wherein the cover element having a surface facing the interior of the at least one housing that carries at least one electrical contact site which is in conducting contact with the at least one active microstructures applied on the cover element or designed integral with the cover element, and wherein the at least one electrical contact site is a raised structure connected electrically conducting to raised structure situated on a surface of the bottom element facing the inside of the at least one housing and being an electrical contact site, which, in turn, is electrically contacted to one of the electrical conductor tracks of the substrate through the at least one enclosing housing, wherein the raised structures have a distance to the side wall of the component.

2. The microstructured component according to claim 1, in which at least one application-specific integrated circuit (ASIC) is provided in the substrate per each of the housings arranged on the substrate.

3. The microstructured component according to claim 2, in which the material of the substrate carrying or surrounding the at least one ASIC is an inorganic material, selected from the group consisting of Si, Sic, GaAs, and InP.

4. The microstructured component according to claim 2, in which the at least one ASIC is an electronic evaluation circuit with one or more circuits for control of one or more sensor elements present in the housing and/or for measurement of its signals and/or for communication with at least one external electrical circuit.

5. The microstructured component according to claim 2, in which at least one ASIC comprises at least one or more elements, which cause at least one of the effects selected from the group comprising signal amplification, linearization of the signals, more intelligent signal filtering, compensation of the temperature path of a signal, position control of an oscillating micro-structure, self-test of a sensor, detection of signals for plausibility, and/or usability and brightness adjustment of an image sensor.

6. The microstructured component according to claim 1, in which the one or more active microstructures is contacted electrically to the electrical conductor track of the substrate by means of a solder consisting of soft solder or obtained by diffusion soldering or by anisotropically or isotropically conductive gluing or by unfilled narrow gap glue connections.

7. The microstructured component according to claim 1, in which each housing is formed from a bottom element and a cover element, between which the one or more active microstructures is situated, which are connected to each other via a sealing frame, which determines the spacing between the surfaces of the bottom and cover element.

8. The microstructured component according to claim 7, wherein the electrical contacting of the one or more active microstructures occurs through the surrounding housing to the electrical conductor track via an electrically conducting structure, which extends through a recess in the bottom element to its outside, which faces the substrate.

9. The microstructured component according to claim 8, in which the recess widens conically toward the outside of the bottom element facing the substrate.

10. The microstructured component according to claim 9, in which the outside of the bottom element that faces the substrate is covered with a passivation layer, which leaves open only those locations of the electrically conducting structure that are provided as electrical contact points, in which a contact material and/or a solder material is present on those locations of the electrically conducting structure that are provided as electrical contact points.

11. The microstructured component according to claim 10, in which at least one of the electrical contact points is situated at least partially above the recess, through which the at least one of the electrical contact points is connected to the electrically conducting structure, or in which at least one of the electrical contact points is situated at a spacing from the recess, through which the at least one of the electrical contact points is connected to the electrically conducting structure.

12. The microstructured component according to claim 1, in which each housing contains more than one active microstructure, and the sealing frame is configured so that at least two active microstructures are separated gas-tight from each other, or that the sealing frame does not hermetically enclose at least one of the active structures, and/or the sealing frame permits limited or controlled gas supply to at least one of the active microstructures.

13. The microstructured component according to claim 1, in which an inertial measurement unit or part of an inertial measurement unit is involved.

14. The microstructured component according to claim 13, comprising one or more different acceleration sensors that can detect accelerations in at least two of the three perpendicular spatial directions x, y, z and/or one or more rotation rate sensors, which can optionally detect rotational rates in at least two of the three perpendicular spatial directions x, y, z.

15. The microstructured component according to claim 14, in which the one or more mentioned acceleration sensors are accommodated within the at least one housing.

16. The microstructured component according to claim 15, in which the at least one housing has one or more cavities and one or more acceleration sensors are accommodated in one or more respective cavities.

17. The microstructured component according to claim 15, in which the at least one housing has one or more cavities and at least two acceleration sensors are arranged in the same cavity.

18. The microstructured component according to claim 17, in which the at least one housing is formed from a bottom element and a cover element, which are connected via a sealing frame, and at least one acceleration sensor is fastened on the bottom element and/or at least one acceleration sensor is fastened on the cover element or is designed integral with the cover element.

19. The microstructured component according to claim 14, comprising at least two different sensors that are accommodated in respective housings.

20. The microstructured component according to claim 14, in which the one or more mentioned rotation rate sensors are accommodated within the at least one housing.

21. The microstructured component according to claim 20, in which the at least one housing has one or more cavities and one or more rotation rate sensors are accommodated in one or more respective cavities.

22. The microstructured component according to claim 20, in which the at least one housing has one or more cavities and at least two rotation rate sensors are arranged in the same cavity.

23. The microstructured component according to claim 22, in which the at least one housing is formed from a bottom element and a cover element, which are connected via a sealing frame, and at least one rotation rate sensor is fastened on the bottom element and/or at least one rotation rate sensor is fastened on the cover element or is designed integral with the cover element.

24. The microstructured component according to claim 1, which is a scalable measurement unit, chosen from measurement units, including at least one image sensor, microphone, pressure sensor or mirror or other actuator or a combination thereof.

25. The microstructured component according to claim 1, further comprising at least one battery or at least one accumulator.

26. The microstructured component according to claim 1, wherein the first one of the at least two active microstructures, which is applied on the cover element or is formed integral with the cover element, is an acceleration sensor and is connected electrically conducting exclusively via the at least one electrical contact site situated in the cover element to the electrical contact site situated on the surface of the bottom element facing the interior of the housing.

27. The microstructured component according to claim 1, wherein the bottom and the cover element of the housing are connected to each other via a sealing frame determining the spacing between the surfaces of the bottom and the cover element, wherein the sealing frame and the raised structures which provide the connection between the said electrical contact site consist of the same material.

28. The microstructured component according to claim 1, wherein the first one of the at least two active microstructures is applied on the cover element or is formed integral with the cover element is a rotation rate sensor, which is fastened to the cover element or formed integral with the cover element, is connected electrically conducting exclusively via the at least one electrical contact site situated in the cover element to the electrical contact site situated on the surface of the bottom element facing the interior of the housing.

29. The microstructured component according to claim 1, wherein the bottom and the cover element of the housing are connected to each other via a sealing frame determining the spacing between the surfaces of the bottom and cover element, wherein the sealing frame and the raised structures which provide the connection between the said electrical contact site consist of the same material.

30. A microstructured component with microsensors or other active microcomponents, comprising: a substrate, which is provided with electrical conductor tracks and at least one housing arranged on the substrate, the housing being formed from a cover element and a bottom element, which are connected via a sealing frame determining the spacing between the surfaces of the bottom and cover element, wherein at least two active structures are accommodated within a single cavity of the at least one housing, at least a first one of the two active structures being applied on the cover element of the housing, whereas at least a second one of the two active structures is applied on the bottom element of the housing, at least one of the active microstructures being contacted through the enclosing housing electrically with one of the electrical conductor tracks of the substrate, wherein the cover element, on its surface facing the interior of the housing, carries at least one electrical contact site which is in conducting contact with the active structure applied on the cover element or designed integral with the cover element, and in which the at least one electrical contact site is a raised structure which is electrically conducting connected via electrical contacts within the at least one housing to an electrical contact site in the form of a raised structure situated on the surface of the bottom element facing the inside of the housing, which, in turn, is contacted to one of the electrical conductor tracks of the substrate through the enclosing housing electrically, wherein the raised structures have a distance to the side wall of the component.

31. A microstructured component with microsensors or other active microcomponents, comprising:
 a substrate comprising electrical conductor tracks and at least one housing arranged on the substrate;
 at least two active structures are accommodated within a single cavity of the at least one housing and at least a first one of the at least two active structures being applied on a cover element of the at least one housing, whereas at least a second one of the at least two active structures is applied on a bottom element of the at least one housing;
 at least one of the active microstructures being electrically contacted through an enclosing of the at least one housing with one of the electrical conductor tracks of the substrate;
 wherein the cover element having a surface facing the interior of the at least one housing that carries at least one electrical contact site which is in conducting contact with the at least one active microstructures applied on the cover element or designed integral with the cover element, and wherein the at least one electrical contact site is a raised structure connected electrically conducting to a raised structure situated on a surface of the bottom element facing the inside of the at least one housing being an electrical contact site, which, in turn, is electrically contacted to one of the electrical conductor tracks of the substrate through the enclosing of the at least one housing, wherein the raised structures are bumps.

32. A microstructured component with microsensors or other active microcomponents, comprising: a substrate, which is provided with electrical conductor tracks and at least one housing arranged on the substrate, the housing being formed from a cover element and a bottom element, which are connected via a sealing frame determining the spacing between the surfaces of the bottom and cover element, wherein at least two active structures are accommodated within a single cavity of the at least one housing, at least a first one of the two active structures being applied on the cover element of the housing, whereas at least a second one of the two active structures is applied on the bottom element of the housing, at least one of the active microstructures being contacted through the enclosing housing electrically with one of the electrical conductor tracks of the substrate, wherein the cover element, on its surface facing the interior of the housing, carries at least one electrical contact site which is in conducting contact with the active structure applied on the cover element or designed integral with the cover element, and in which the at least one electrical contact site is a raised structure which is electrically conducting connected via electrical contacts within the at least one housing to an electrical contact site in the form of a raised structure situated on the surface of the bottom element facing the inside of the housing, which, in turn, is contacted to one of the electrical conductor tracks of the substrate through the enclosing housing electrically, wherein the raised structures are bumps.

33. A microstructured component according to claim 32, wherein a side wall of the component and the bumps are made of conducting material.

34. A microstructured component according to claim 33, wherein the conducting material of the side wall and of the bumps is the same.

35. A microstructured component according to claim 32, wherein the material of the side wall is an organic material.

* * * * *

UNITED STATES PATENT AND TRADEMARK OFFICE
CERTIFICATE OF CORRECTION

PATENT NO. : 8,129,838 B2  
APPLICATION NO. : 12/153174  
DATED : March 6, 2012  
INVENTOR(S) : Wolfgang Reinert Page 1 of 1

It is certified that error appears in the above-identified patent and that said Letters Patent is hereby corrected as shown below:

Title Page:  
Item "(73) Assignee: Fraunhofer-Gesellschaft Zur, Munich (DE)"

should be corrected to read:

--(73) Assignee: Fraunhofer-Gesellschaft Zur Foerderung der angewandten Forschung e.V., Muenchen (DE)--

Signed and Sealed this  
Twenty-seventh Day of August, 2013

Teresa Stanek Rea  
*Acting Director of the United States Patent and Trademark Office*